(12) United States Patent
Xi et al.

(10) Patent No.: US 10,468,394 B1
(45) Date of Patent: Nov. 5, 2019

(54) DISPLAY DEVICE

(71) Applicant: Au Optronics Corporation, Hsinchu (TW)

(72) Inventors: Peng-Bo Xi, Taipei (TW); Chen-Chi Lin, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/172,880

(22) Filed: Oct. 29, 2018

(30) Foreign Application Priority Data

Jun. 28, 2018 (TW) .............................. 107122363 A

(51) Int. Cl.
*H01L 25/07* (2006.01)
*H01L 25/04* (2014.01)
*H01L 25/16* (2006.01)
*H01L 23/31* (2006.01)
(Continued)

(52) U.S. Cl.
CPC ........ *H01L 25/0753* (2013.01); *H01L 23/053* (2013.01); *H01L 23/3128* (2013.01); *H01L 23/49816* (2013.01); *H01L 23/49838* (2013.01); *H01L 23/5386* (2013.01); *H01L 23/544* (2013.01); *H01L 24/02* (2013.01); *H01L 24/16* (2013.01); *H01L 24/32* (2013.01); *H01L 25/048* (2013.01); *H01L 25/167* (2013.01); *H01L 27/124* (2013.01); *H01L 27/1255* (2013.01); *H01L 33/483* (2013.01); *H01L 33/507* (2013.01); *H01L 33/58* (2013.01);
(Continued)

(58) Field of Classification Search
CPC . H01L 25/0753; H01L 25/048; H01L 25/167; H01L 25/0652; H01L 25/071; H01L 23/053; H01L 23/3128; H01L 23/49816; H01L 23/49838; H01L 23/5386; H01L 23/544
See application file for complete search history.

(56) References Cited

U.S. PATENT DOCUMENTS 6,870,186 B2 * 3/2005 Park ..................... H01L 27/3253
257/40
7,897,975 B2 * 3/2011 Kim ..................... H01L 51/5203
257/72
(Continued)

FOREIGN PATENT DOCUMENTS

CN 101587670 11/2009
CN 102982744 3/2013
(Continued)

*Primary Examiner* — Ida M Soward
(74) *Attorney, Agent, or Firm* — JCIPRNET

(57) ABSTRACT

A display device includes an array substrate, two light-emitting element substrates, a plurality of first connection elements, and a plurality of second connection elements. The array substrate includes two pixel circuits. Each of the pixel circuits includes three sub-pixel circuits, three first conductive pads, and a second conductive pad. Each of the light-emitting element substrates includes three light-emitting elements, three first connection pads, and a second connection pad. The first connection elements respectively and electrically connect corresponding one of the first conductive pads to corresponding one of the first connection pads. The second connection elements respectively and electrically connect corresponding one of the second conductive pads to corresponding one of the second connection pads.

17 Claims, 14 Drawing Sheets

(51) Int. Cl.
*H01L 23/49* (2006.01)
*H01L 23/544* (2006.01)
*H01L 23/538* (2006.01)
*H01L 25/065* (2006.01)
*H01L 25/075* (2006.01)
*H01L 23/00* (2006.01)
*H01L 33/58* (2010.01)
*H01L 33/62* (2010.01)
*H01L 33/48* (2010.01)
*H01L 27/12* (2006.01)
*H01L 51/52* (2006.01)
*H01L 33/50* (2010.01)
*H01L 23/498* (2006.01)
*H01L 23/053* (2006.01)
*G09F 9/33* (2006.01)

(52) U.S. Cl.
CPC .......... *H01L 33/62* (2013.01); *H01L 51/5284* (2013.01); *G09F 9/33* (2013.01); *H01L 25/0652* (2013.01); *H01L 25/071* (2013.01); *H01L 2223/54426* (2013.01); *H01L 2224/0237* (2013.01); *H01L 2224/02373* (2013.01); *H01L 2224/16227* (2013.01); *H01L 2224/32225* (2013.01)

(56) References Cited

U.S. PATENT DOCUMENTS

| | | | | |
|---|---|---|---|---|
| 8,354,980 B2* | 1/2013 | Kwak | .................. | H01L 27/322 313/506 |
| 8,373,624 B2* | 2/2013 | Chan | .................. | H01L 51/5284 315/169.3 |
| 8,541,939 B2* | 9/2013 | Wang | .................. | G09G 3/3225 313/503 |
| 8,581,491 B2* | 11/2013 | Yamashita | ........ | G02F 1/133305 313/512 |
| 9,219,087 B2* | 12/2015 | Jinta | ..................... | H01L 25/048 |
| 2006/0017380 A1* | 1/2006 | Fukunaga | ........... | H01L 27/3244 313/506 |
| 2015/0021571 A1* | 1/2015 | Yamakita | ............ | H01L 51/5228 257/40 |
| 2015/0340655 A1* | 11/2015 | Lee | ....................... | H01L 51/525 257/40 |
| 2017/0179192 A1* | 6/2017 | Zhang | .................... | H01L 23/29 |
| 2017/0222169 A1* | 8/2017 | Matsubara | ........... | H01L 51/504 |
| 2018/0165496 A1* | 6/2018 | Cheng | ....................... | G09F 9/00 |
| 2018/0166429 A1* | 6/2018 | Chong | .................. | H01L 25/167 |
| 2018/0181240 A1* | 6/2018 | Heo | ....................... | G06F 3/0412 |
| 2018/0254436 A1* | 9/2018 | Fukuda | ............... | H01L 51/5265 |
| 2018/0254437 A1* | 9/2018 | Kim | ...................... | H01L 27/322 |
| 2018/0269417 A1* | 9/2018 | Sudo | .................. | H01L 51/5206 |
| 2018/0351135 A1* | 12/2018 | Seo | ...................... | H01L 27/3213 |
| 2019/0056543 A1* | 2/2019 | Ueda | ....................... | G02B 5/20 |
| 2019/0103426 A1* | 4/2019 | Tanaka | .................... | G01N 21/64 |

FOREIGN PATENT DOCUMENTS

| | | |
|---|---|---|
| CN | 103296017 | 9/2013 |
| CN | 104241466 | 12/2014 |
| CN | 105427757 | 3/2016 |
| CN | 106847864 | 6/2017 |
| CN | 206685066 | 11/2017 |

* cited by examiner

US 10,468,394 B1

DISPLAY DEVICE

CROSS REFERENCE TO RELATED APPLICATION

This application claims the priority benefit of Taiwan application serial no. 107122363, filed on Jun. 28, 2018. The entirety of the above-mentioned patent application is hereby incorporated by reference herein and made a part of specification.

BACKGROUND

1. Field of the Disclosure

The disclosure relates to a display device, and more particularly, to a display device including an array substrate and at least two light-emitting element substrates.

2. Description of Related Art

At present, a mass transfer technique is often used in the manufacturing process of a display device. The mass transfer technique is used to transfer a large number of light-emitting elements (e.g., light-emitting diodes) onto a circuit substrate, and then electrically connect the light-emitting elements to pixel circuits on the circuit substrate. However, during the process of transferring a large number of light-emitting elements, the light-emitting elements can easily be misaligned such that the light-emitting elements cannot be electrically connected to the circuit substrate properly. These misaligned light-emitting elements would seriously affect a yield production of the display device. Therefore, there is an urgent need for a solution to the above problem.

SUMMARY OF THE DISCLOSURE

The disclosure provides a display device having a more preferable yield production.

The display device of the disclosure includes an array substrate, at least two light-emitting element substrates, a plurality of first connection elements, and a plurality of second connection elements. The array substrate includes a carrier substrate and an active element layer. The active element layer is located on the carrier substrate, and includes two pixel circuits, a first power line and a second power line. Each of the pixel circuits includes at least three sub-pixel circuits, at least three first conductive pads and a second conductive pad. Each of the sub-pixel circuits includes a driving element, a switching element and a signal line. The driving element has a first terminal, a second terminal and a control terminal. The control terminal of the driving element is electrically connected to the signal line and the switching element. The first terminal of the driving element is electrically connected to the first power line. Each of first conductive pads is correspondingly and electrically connected to the second terminal of the respective driving element. The second conductive pad is electrically connected to the second power line. The two light-emitting element substrates are respectively and electrically connected to corresponding one of the pixel circuits. Each of the light-emitting element substrates includes a substrate, at least three light-emitting elements, at least three first connection pads and a second connection pad. The at least three light-emitting elements are located on the substrate, and respectively include a first connection terminal and a second connection terminal. The at least three first connection pads are respectively and electrically connected to the first connection terminal of corresponding one of the light-emitting elements. The second connection pad is electrically connected to the second connection terminals of the at least three light-emitting elements, and each of the first connection pads is separated from the second connection pad. The first connection elements respectively and electrically connect corresponding one of the first conductive pads to corresponding one of the first connection pads. The second connection elements respectively and electrically connect corresponding one of the second conductive pads to corresponding one of the second connection pads.

Based on the above, the disclosure can reduce the difficulty of the manufacturing process of the display device and solve the problem of insufficient production yield for the display device.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
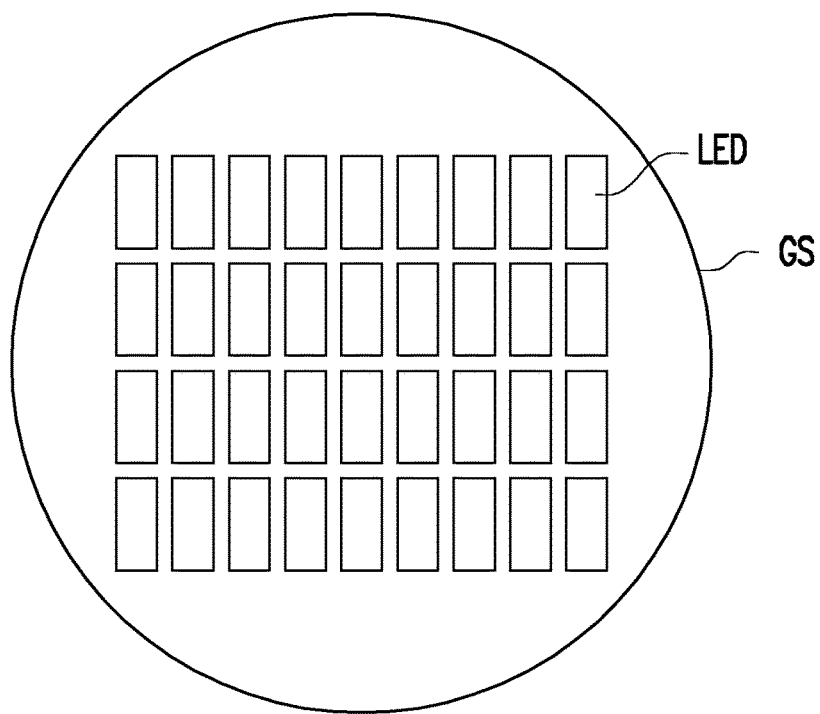
FIG. 1A to FIG. 1D are schematic top views for a manufacturing method of a display device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Various embodiments of the disclosure are disclosed in the drawings, and for the sake of clarity, many of the practical details are set forth in the following description. However, it should be understood that these practical details should not be used to limit the disclosure. In other words, these practical details are not necessary in certain embodiments of the disclosure. In addition, to simplify the drawings, some conventional structures and elements in the drawings will be shown in a simple and schematic manner.

Throughout the specification, the same reference numerals in the accompanying drawings denote the same or similar elements. In the accompanying drawings, thicknesses of layers, films, panels, regions and so on are exaggerated for clarity. It should be understood that when an element such as a layer, film, region or substrate is referred to as being "on" or "connected to" another element, it can be directly on or connected to the other element, or intervening elements may also be present between said element and said another element. In contrast, when an element is referred to as being "directly on" or "directly connected to" another element, there are no intervening elements present between said element and said another element. As used herein, the term "connected" may refer to physically connected and/or electrically connected. Therefore, intervening elements may be present between two elements when the two elements are "electrically connected" or "coupled" to each other.

It should be understood that, although the terms "first", "second", etc., may be used herein to describe various elements, components, regions, layers and/or sections, these elements, components, regions, layers, and/or sections should not be limited by these terms. These terms are used to distinguish one element, component, region, layer or section from another element, component, region, layer or section.

The terminology used herein is for the purpose of describing particular embodiments and is not intended to be limiting of the disclosure. As used herein, the singular forms "a", "an" and "the" are intended to include the plural forms as well, unless the context clearly indicates otherwise. Herein, "or" represents "and/or". The term "and/or" used herein includes any or a combination of one or more of the associated listed items. It will be further understood that the terms "comprises", "comprising", "includes" and/or "including", when used herein, specify the presence of stated features, regions, integers, steps, operations, elements, and/or components, but do not preclude the presence or addition of one or more other features, regions, integers, steps, operations, elements, components, and/or groups thereof.

Moreover, relative terms such as "below" or "bottom" and "above" or "top" may serve to describe the relation between one element and another element in the text according to the illustration of the drawings. It should also be understood that the relative terms are intended to include different orientations of a device in addition to the orientation shown in the drawings. For example, if a device in the drawings is flipped, an element described as being disposed "below" other elements shall be re-orientated to be "above" other elements. Thus, the exemplary term "below" may cover the orientations of "below" and "above", depending on a specific orientation of the drawings. Similarly, if a device in a figure is flipped over, the element originally described to be located "below" or "underneath" other element is oriented to be located "on" the other element. Therefore, the illustrative term "under" or "below" may include orientations of "above" and "under".

The term "approximately" or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For example, "approximately" may mean within one or more standard deviations, or within, for example, ±30%, ±20%, ±15%, ±10%, ±5% of the stated value. Moreover, a relatively acceptable range of deviation or standard deviation may be chosen for the term "approximately" or "substantially" as used herein based on optical properties, etching properties or other properties, instead of applying one standard deviation across all the properties.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

FIG. 1A to FIG. 1D are schematic top views for a manufacturing method of a display device according to an embodiment of the disclosure.

First, referring to FIG. 1A, a plurality of light-emitting elements LED are formed on a growth substrate GS.

Figure 1B:
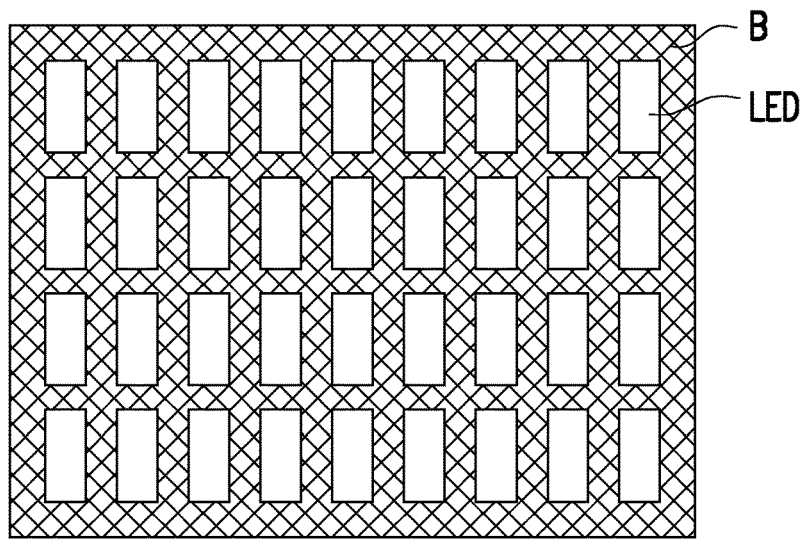

Referring to FIG. 1B, the light-emitting elements LED on the growth substrate GS are transferred onto a substrate B by a mass transfer technique. It should be noted that, illustration of some members on the substrate B is omitted in FIG. 1B.

Figure 1C:
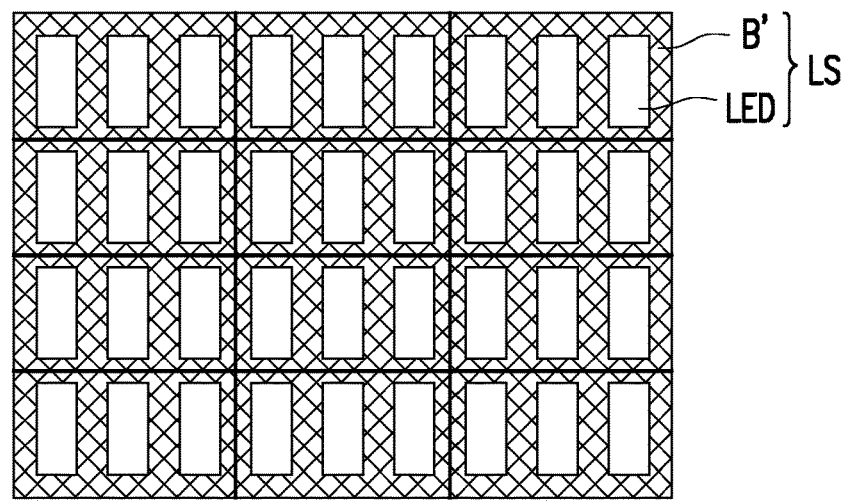

Referring to FIG. 1C, the substrate B and a part of members thereon are cut to form a plurality of substrates B'. Although each light-emitting element substrate LS having three light-emitting elements LED is used as an example in FIG. 1C, the disclosure is not limited thereto. The light-emitting element substrate LS includes three light-emitting elements LED. In other words, the light-emitting element substrate LS may have three or more light-emitting elements LED. Each of the light-emitting elements LED may be, more preferably, a micro light-emitting element. A size of the micro light-emitting element is, for example, less than about 100 μm (more preferably, less than about 50 μm and greater than about 0 μm). The micro light-emitting element may be, for example, an organic light-emitting element or an inorganic light-emitting element, and more preferably, the inorganic light-emitting element. However, the disclosure is not limited thereto. A structure of the micro light-emitting element may be a P-N diode, a P-I-N diode or other suitable structures. The micro light-emitting element may include an organic material (e.g., an organic polymer light-emitting material, an organic small molecule light-emitting material, an organic complex light-emitting material, or other suitable materials, or a combination of said materials), an organic material (e.g., a perovskite material, a rare earth ion light-emitting material, a rare earth fluorescent material, a semiconductor light-emitting material, or other suitable materials, or a combination of said materials), or other suitable materials, or a combination of aforementioned materials.

In some embodiments, after the light-emitting elements LED are transferred onto the substrate B, banks, connection pads or other suitable members or at least one of the aforesaid elements are formed on the substrate B first before the substrate B is cut. However, the disclosure is not limited thereto. In some embodiments, banks, connection pads, other suitable members, or at least one of the aforesaid elements are formed on the substrate B first before the light-emitting elements LED are transferred onto the substrate B.

In some embodiments, before the substrate B is cut or after the substrate B is cut, a detection may be optionally performed on the transferred light-emitting elements LED to determine whether the light-emitting elements LED are correctly aligned.

Figure 1D:
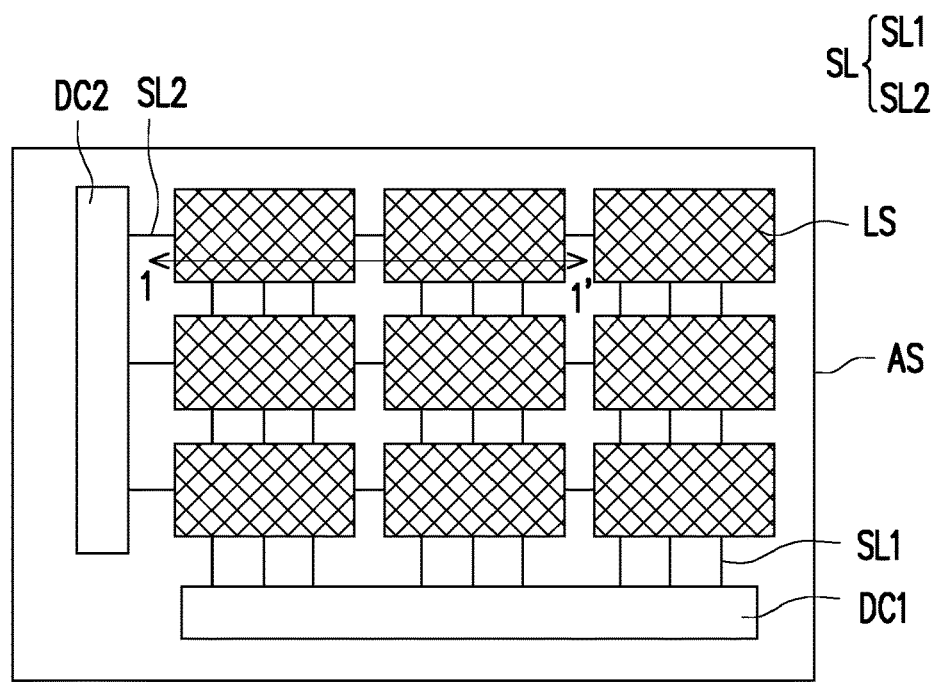

Referring to FIG. 1D, the light-emitting element substrates LS are placed onto an array substrate AS to complete a display device 10. In this embodiment, the light-emitting element substrates LS are electrically connected to a driving circuit DC1 and a driving circuit DC2 through at least one signal line SL (e.g., a signal line SL1 and a signal line SL2) of the array substrate AS. In an embodiment, at least one of the driving circuit DC1 and the driving circuit DC2 or a driving circuit integrating the driving circuit DC1 and the driving circuit DC2 may be located between the light-emitting elements LED. In other embodiments, the driving circuits DC1 or DC2 may be a chip bonding on the array substrate AS or a circuit manufactured when manufacturing the array substrate AS.

Figure 2:
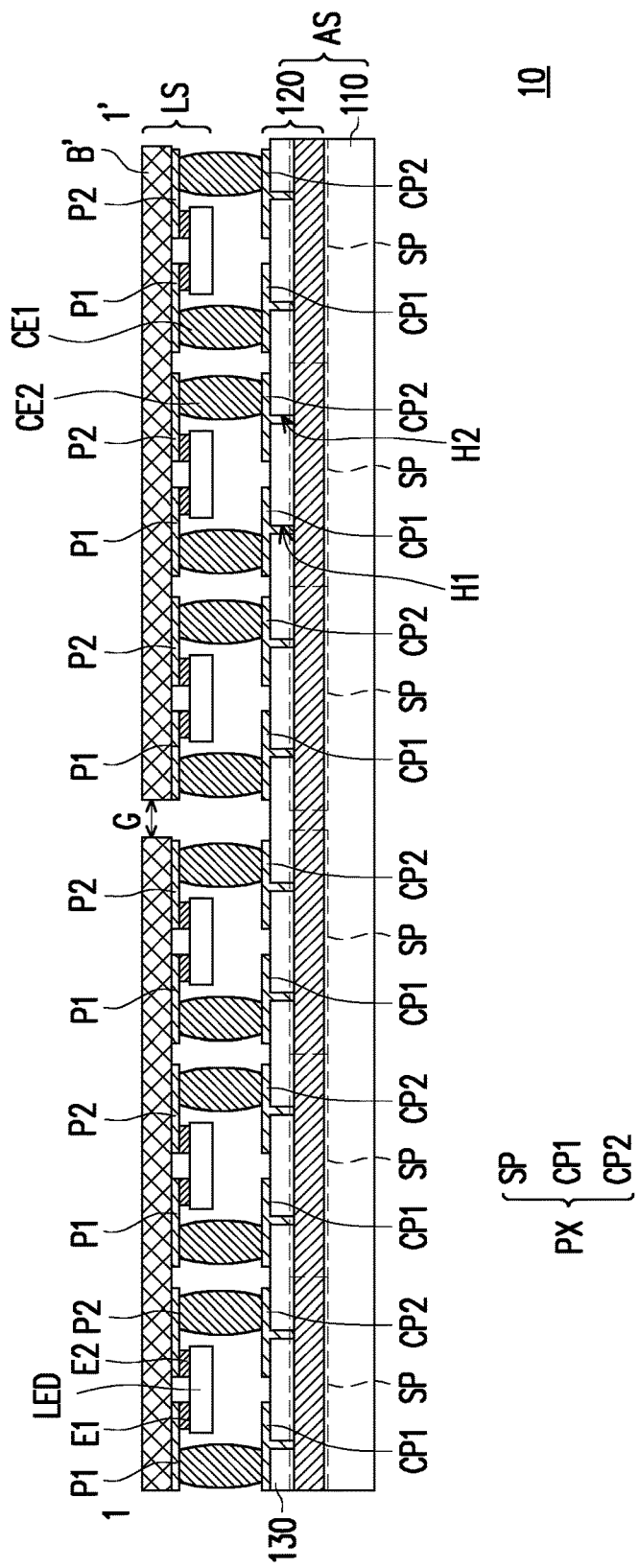
FIG. 2 is a schematic cross-sectional view taken along a section line 11' depicted in FIG. 1D.
Figure 3:
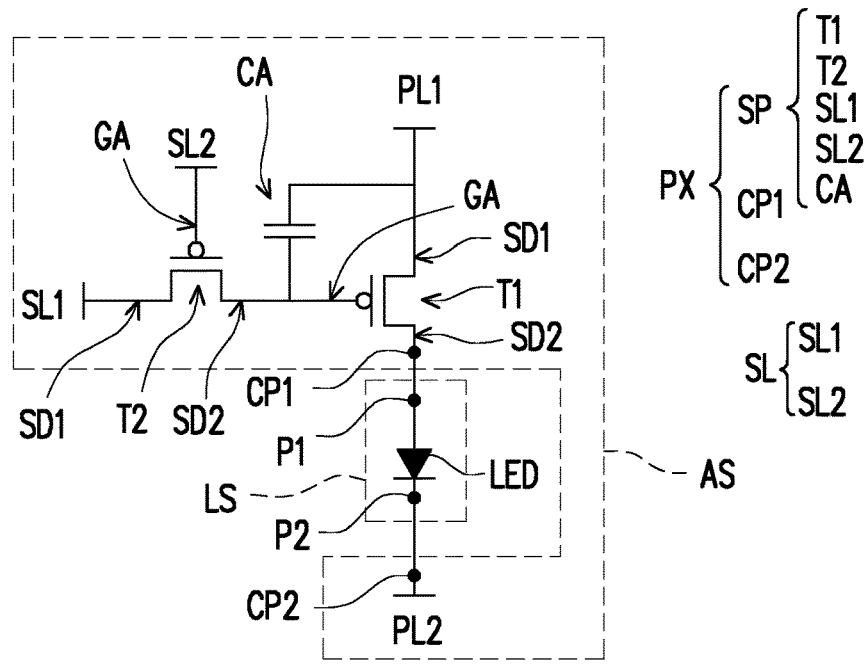
FIG. 3 is a schematic partial circuit diagram of a display device according to an embodiment of the disclosure.

FIG. 2 is a schematic cross-sectional view taken along a section line 11' depicted in FIG. 1D. FIG. 3 is a schematic partial circuit diagram of a display device according to an embodiment of the disclosure. FIG. 3 is, for example, the schematic partial circuit diagram of the display device of FIG. 2. Referring to FIG. 2 and FIG. 3, the array substrate AS includes a carrier substrate 110 and an active element layer 120.

The active element layer 120 is located on the carrier substrate (or namely received substrate) 110 and may include at least two pixel circuits PX, a first power line PL1, a second power line PL2, a plurality of first conductive pads CP1, and a plurality of second conductive pads CP2. Each of the pixel circuits PX includes a plurality of sub-pixel circuits SP, a plurality of said first conductive pads CP1, and at least one said second conductive pad CP2. In a more preferable embodiment, each of the pixel circuits PX includes at least three said sub-pixel circuits SP, at least three said first conductive pads CP1, and at least one said second conductive pad CP2. Although the cross-sectional view of FIG. 2 takes the active element layer 120 including six said first conductive pads CP1 and six said second conductive pads CP1 as an example, the disclosure is not limited thereto. In some embodiments, more preferably, by including six said first conductive pads CP1 and two said second conductive pads CP1 on the active element layer 120, alignment tolerances of the light-emitting element substrates LS and the active element layer 120 in the subsequent process may be improved. However, the disclosure is not intended to limit the number of the first conductive pads CP1 and/or the number of the second conductive pads CP2.

In the array substrate AS, each of the sub-pixel circuits SP at least includes a driving element T1, a switching element T2, and at least two signal lines SL (e.g., the signal line SL1 and the signal line SL2). Each of the driving elements T1 and the switching element T2 has a first terminal SD1, a second terminal SD2 and a control terminal GA. The control terminal GA of the driving element T1 is electrically connected to the switching element T2. For example, the control terminal GA of the driving element T1 is electrically connected to the second terminal SD2 of the switching element T2. In the embodiment, the control terminal GA of the driving element T1 is electrically connected to the signal line SL1 and the signal line SL2 through the switching element T2. For example, the control terminal GA of the driving element T1 is electrically connected to the signal line SL1 and the signal line SL2 through the control terminal GA and the first terminal SD1 of the switching element T2 respectively, but is not limited thereto. The signal line SL1 and the signal line SL2 may be, for example, a data line and a scan line, respectively, but not limited thereto. The first terminal SD1 of the driving element T1 is electrically connected to the first power line PL1. In the embodiment, the driving element T1 and the switching element T2 may be, for example, P-type thin film transistors. However, the disclosure is not limited thereto. In the embodiment, each of the sub-pixel circuits SP may further include a capacitor CA, and one terminal of the capacitor CA is electrically connected to the control terminal GA of the driving element T1. For example, one terminal of the capacitor CA is electrically connected to the control terminal GA of the driving element T1 and the second terminal SD2 of the switching element T2, and another terminal of the capacitor CA is electrically connected to the first power line PL1 and the first terminal SD1 of the driving element T1.

Figure 4:
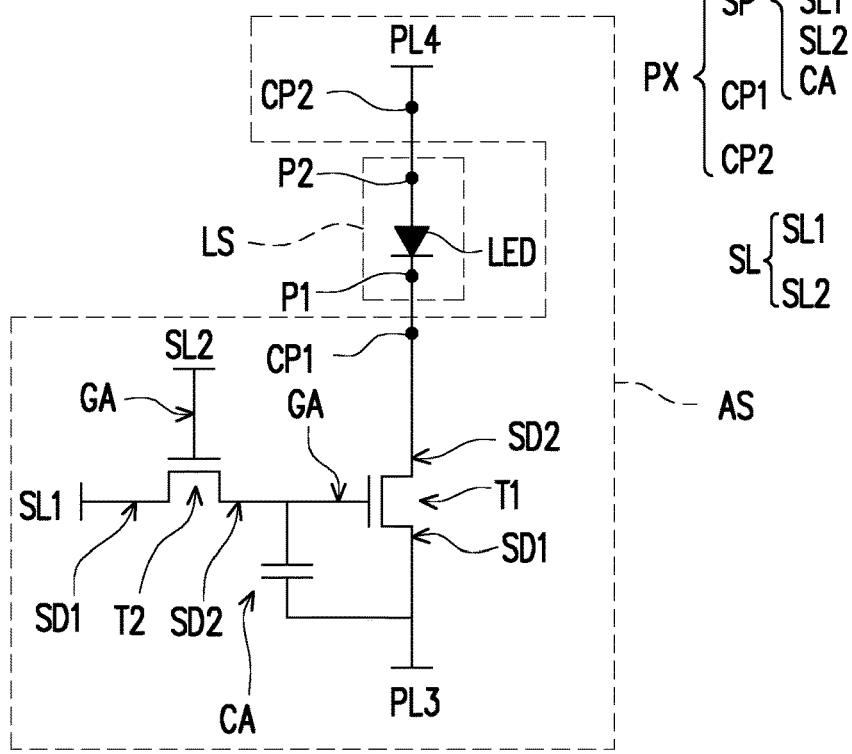
FIG. 4 is a schematic partial circuit diagram of a display device according to an embodiment of the disclosure.

In an embodiment, the driving element T1 and the switching element T2 may be, for example, N-type thin film transistors. With reference to FIG. 4, FIG. 4 is a schematic partial circuit diagram of a display device according to an embodiment of the disclosure. It should be noted that the reference numerals and a part of the contents in the embodiment of FIG. 3 are also used to describe the embodiment of FIG. 4, in which the same reference numerals are used to represent identical or similar elements, and thus descriptions of the same technical contents are omitted. The omitted description can refer to the foregoing embodiment, which is not repeated hereinafter. In the embodiment, the first terminal SD1 of the driving element T1 is electrically connected to a first power line PL3. One terminal of the capacitor CA is electrically connected to the control terminal GA of the driving element T1. For example, one terminal of the capacitor CA is electrically connected to the control terminal GA of the driving element T1 and the second terminal SD2 of the switching element T2, and another terminal of the capacitor CA is electrically connected to the first power line PL3 and the first terminal SD1 of the driving element T1. In other embodiments, one of the driving element T1 and the switching element T2 may be, for example, the N-type thin film transistor, and another one of the driving element T1 and the switching element T2 may be, for example, the P-type thin film transistor.

In addition, a total of the driving element T1, the switching element T1 and the capacitor CA in the foregoing embodiment may be referred to as two active elements and one capacitor (which may be expressed as 2T1C). In other embodiments, each of the sub-pixel circuits SP may also include other active elements. Also, a total of the driving elements T1, the switching elements T2, the other active elements and the capacitors included by each of the sub-pixel circuits SP may be changed based on the design, and may be referred to as, for example, three active elements and one or two capacitors (which may be expressed as 3T1C/2C), four active elements and one or two capacitors (which may be expressed as 4T1C/2C), five active elements and one or two capacitors (which may be expressed as 5T1C/2C), six active elements and one or two capacitors (which may be expressed as 6T1C/2C), or other suitable circuit configurations.

In this embodiment, each of the first conductive pads CP1 is correspondingly and electrically connected to the second terminal SD2 of the respective driving element T1. The second conductive pad CP2 is electrically connected to the second power line PL2 (referring to FIG. 3) or the second power line PL4 (referring to FIG. 4).

With reference to FIG. 2, FIG. 3 and FIG. 4, in certain embodiments, the array substrate AS further includes an insulation layer 130. The insulation layer 130 covers the three sub-pixel circuits SP of each of the pixel circuits PX. The first conductive pads CP1 of each of the pixel circuits PX are electrically connected to the second terminal SD2 of corresponding one of the driving elements T1 through first openings H1 of the insulation layer 130. Further, the second conductive pad CP2 of each of the pixel circuits PX is electrically connected to the second power line PL2 (referring to FIG. 3) or the second power line PL4 (referring to FIG. 4) through a second opening H2 of the insulation layer 130.

The two light-emitting element substrates LS are respectively and electrically connected to the sub-pixel circuits SP in corresponding one of the pixel circuits PX. In the embodiment, each of the light-emitting element substrates LS is electrically connected to the at least three corresponding sub-pixel circuits SP. The light-emitting element substrate LS includes the substrate B', the light-emitting elements LED, a plurality of first connection pads P1 and a plurality of second connection pads P2. The light-emitting elements LED may include light-emitting diodes with colors substantially identical to or different from each other, such as a red light-emitting diode, a green light-emitting diode and a blue light-emitting diode. Although FIG. 2 takes the light-emitting element substrate SL including three said first connection pads P1 and three said second connection pads P2 as an example, the disclosure is not limited thereto. In some embodiments, more preferably, by including three said first connection pads P1 and one said second connection pad P2 on the light-emitting element substrate LS, alignment tolerances of the light-emitting element substrates LS and the active element layer 120 in the subsequent process may be improved. However, the disclosure is not intended to limit the numbers or the positions of the first conductive pads CP1 and/or the second conductive pads CP2. A gap G is provided between the two light-emitting element substrates LS, but the disclosure is not limited thereto. In other words, an area occupied by the pixel circuits PX corresponding to each of the light-emitting element substrates LS may be greater than an area of one said light-emitting element substrate LS, but the disclosure is not limited thereto.

At least three said light-emitting elements LED are located on the substrate B', and each of the at least three said light-emitting elements LED include a first connection terminal E1 and a second connection terminal E2. In this embodiment, the light-emitting elements LED are horizontal type light-emitting diodes, and the first connection terminal E1 and the second connection terminal E2 are, for example, corresponding to semiconductor layers of the light-emitting element LED with different polarities. The first connection terminal E1 and the second connection terminal E2 may parts of the semiconductor layers of the light-emitting element LED with different polarities, or may also be electrodes connected to the semiconductor layers of the light-emitting element LED with different polarities. In the embodiment, because the first connection terminal E1 and the second connection terminal E2 of the light-emitting element LED face the corresponding substrate B', the light-emitting element LED can be electrically connected to the first connection pad P1 and the second connection pad P2 easily.

The first connection pads P1 are respectively and electrically connected to the first connection terminal E1 of the corresponding light-emitting element LED. The second connection pads P2 are respectively and electrically connected to the second connection terminal E2 of the corresponding light-emitting element LED. In some preferable embodiments, the second connection terminal E2 of each of the light-emitting elements LED is connected to substantially the same common voltage so the second connection terminal E2 of each of the light-emitting elements LED can be electrically connected to the same second connection pad P2. From another perspective, one said second connection pad P2 may be electrically connected to the second connection terminals E2 of the at least three said light-emitting elements LED. Each of the first connection pads P1 is separated from the second connection pad P2. In certain embodiments, at least one of the first connection pad P1 and the second connection pad P2 may be a single-layer or multi-layer structure, and may be made of a conductive adhesive, a solder, a non-transparent conductive material, a transparent or translucent conductive material, or other suitable conductive materials. However, the disclosure is not limited in this regard. The non-transparent conductive material includes a metal, an alloy, or other suitable materials, an oxide of said materials, a nitride of said materials, an oxynitride of said materials, or a combination of at least two of said materials. The transparent or translucent conductive material includes an indium tin oxide, an indium zinc oxide, an indium gallium zinc oxide, an indium gallium oxide, a metal or an alloy with thickness less than 60 Å, a carbon nanotube/rod, other suitable materials, or a combination of at least two said materials.

In the embodiment, the light-emitting elements LED of light-emitting element substrate LS are driven by the array substrate AS. The light-emitting element substrate LS may exclude the elements for driving the light-emitting elements LED, such as the active element. In this way, the rework cost of the light-emitting element substrate LS may be lower.

A plurality of first connection elements CE1 respectively and electrically connect corresponding one of the first conductive pads CP1 to corresponding one of the first connection pads P1. A plurality of second connection elements CE2 respectively and electrically connect corresponding one of the second conductive pads CP2 to corresponding one of the second connection pads P2. At least one of the first connection element CE1 and the second connection element CE2 may be a single-layer or multi-layer structure, and may be made of, preferably, a conductive adhesive, a solder, or other suitable conductive materials. However, the disclosure is not limited in this regard. In other embodiments, at least one of the first connection element CE1 and the second connection element CE2 may be a non-transparent conductive material, a transparent or translucent conductive material, or an insulation pillar covered by at least one of said conductive materials (such as the insulation pillar extends towards the carrier substrate 110) or other suitable conductive materials. The non-transparent conductive material includes a metal, an alloy, or other suitable materials, an oxide of said materials, a nitride of said materials, an oxynitride of said materials, or a combination of at least two of said materials. The transparent or translucent conductive material includes an indium tin oxide, an indium zinc oxide, an indium gallium zinc oxide, an indium gallium oxide, a metal or an alloy with thickness less than 60 Å, a carbon nanotube/rod, other suitable materials, or a combination of at least two said materials. The insulation pillar may be a single-layer or multi-layer structure, and may be made of an organic material, an inorganic material or other suitable materials.

Based on the above, since the light-emitting elements LED are located in the light-emitting element substrate LS, the light-emitting element substrate LS with the light-emitting elements LED correctly aligned after the transferring process may be directly chosen to be electrically connected to the array substrate AS. Even if the light-emitting elements LED are not correctly aligned after the transferring process, it only requires reworking on the light-emitting element substrate LS at most. Accordingly, compared to the display device with the light-emitting elements LED directly transferred onto the array substrate AS by the mass transfer technique, the display device 10 can have a higher yield production.

Figure 5:
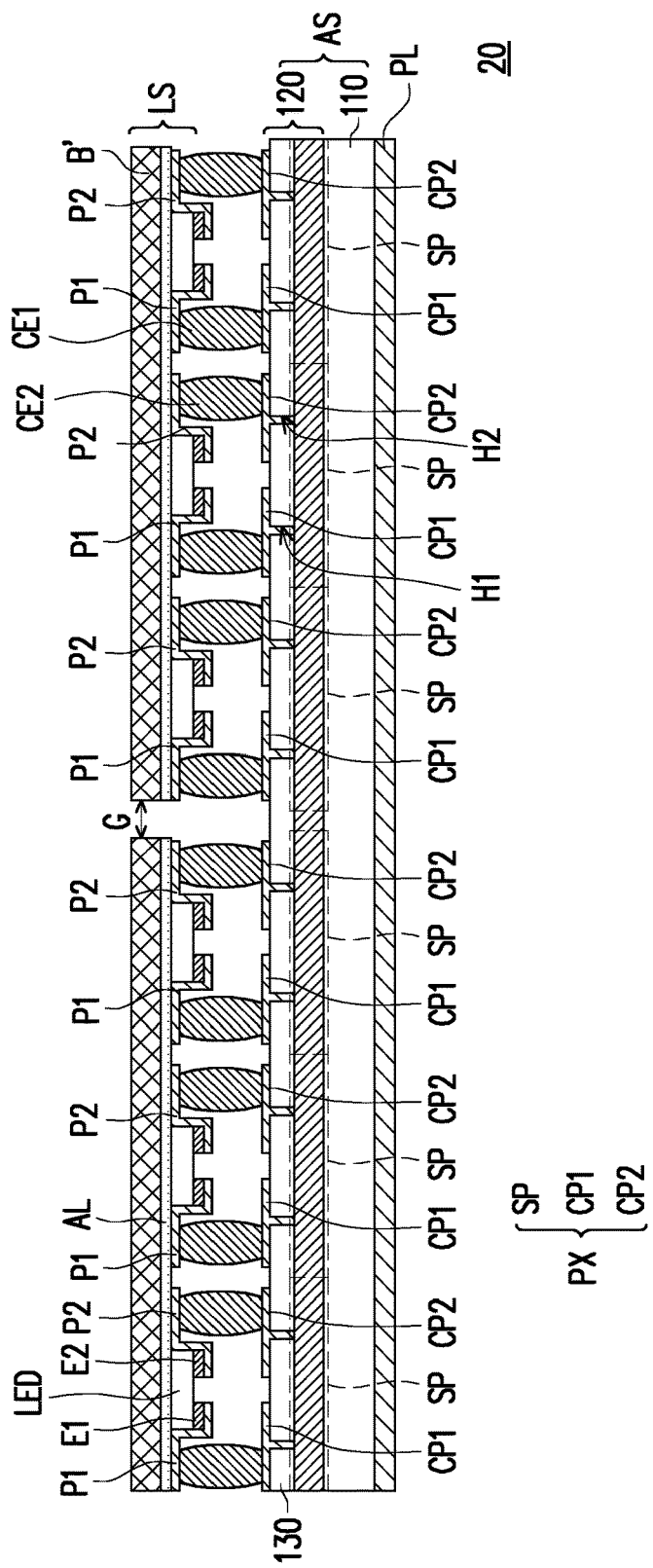
FIG. 5 is a schematic cross-sectional view of a display device according to an embodiment of the disclosure.

FIG. 5 is a schematic cross-sectional view of a display device according to an embodiment of the disclosure. It should be noted that the reference numerals and a part of the contents in the embodiment of FIG. 2 are also used to describe the embodiment of FIG. 5, in which the same reference numerals are used to represent identical or similar elements, and thus descriptions of the same technical contents are omitted. The omitted description can refer to the foregoing embodiment, which is not repeated hereinafter.

A major difference between a display device 20 of FIG. 5 and the display device 10 of FIG. 2 is that the light-emitting elements LED are disposed differently. With reference to FIG. 5, the light-emitting elements LED of the display device 20 are fixed on the substrate B' by an adhesive layer AL. The first connection terminal E1 and the second connection terminal E2 of each of the light-emitting elements LED face the array substrate AS.

In the embodiment, after the light-emitting element LED are transferred onto the substrate B' and fixed on the substrate B' by the adhesive layer AL, the first connection pads P1 and the second connection pads P2 are then formed on the light-emitting elements LED. The first connection pads P1 are respectively and electrically connected to the first connection terminal E1 of the corresponding light-emitting element LED. The second connection pads P2 are respectively and electrically connected to the second connection terminal E2 of the corresponding light-emitting element LED. In this embodiment, the first connection pad P1 and the second connection pad P2 may be a single-layer or multi-layer structure, and may be made of a non-transparent conductive material, a transparent or translucent conductive material, or other suitable conductive materials. The non-transparent conductive material includes a metal, an alloy, or other suitable materials, an oxide of said materials, a nitride of said materials, an oxynitride of said materials, or a combination of at least two of said materials. The transparent or translucent conductive material includes indium tin oxide, indium zinc oxide, indium gallium zinc oxide, indium gallium oxide, a metal or an alloy with thickness less than 60 Å, a carbon nanotube/rod, other suitable materials, or a combination of at least two said materials.

In the embodiment, if a light-emitting direction of the light-emitting elements LED faces, for example, the carrier substrate 110 of the array substrate AS, the array substrate AS may optionally further include a polarizer PL located on the light-emitting direction of the light-emitting elements LED. For instance, the polarizer PL is located on a surface (e.g., an outer surface) of the carrier substrate 110, thereby reducing the influence of ambient light on the display quality of the display device 20. However, the disclosure is not limited thereto. Because the user views the outer surface of the carrier substrate 110 or an outer surface of the polarizer PL instead of viewing an outer surface of the substrate B', the outer surface of the carrier substrate 110 or the outer surface of the polarizer PL may be regarded as a display surface.

In addition, the polarizer PL of the present embodiment may also be applied to the foregoing embodiment (e.g., in FIG. 2). If the polarizer PL is applied to the light-emitting elements LED in FIG. 2 while the light-emitting direction of the light-emitting elements LED faces, for example, the substrate B' of the light-emitting element substrate LS, the polarizer PL is disposed on a surface (e.g., the outer surface) of the substrate B'. Also, the user views the outer surface of the substrate B' or the outer surface of the polarizer PL instead of viewing an outer surface of the carrier substrate 110 of the array substrate AS. In this case, the outer surface of the substrate B' or the outer surface of the polarizer PL may be regarded as the display surface. If the polarizer PL is applied to the light-emitting elements LED in FIG. 2 while the light-emitting direction of the light-emitting elements LED faces, for example, the carrier substrate 110 of the array substrate AS, the polarizer PL is disposed on a surface (e.g., the outer surface) of the carrier substrate 110. Also, the user views the outer surface of the carrier substrate 110 or the outer surface of the polarizer PL instead of viewing the outer surface of the substrate B' of the light-emitting element substrate LS. In this case, the outer surface of the carrier substrate 110 or the outer surface of the polarizer PL may be regarded as the display surface.

Based on the above, since the light-emitting elements LED are located in the light-emitting element substrate LS, the light-emitting element substrate LS with the light-emitting elements LED correctly aligned after the transferring process may be directly chosen to be electrically connected to the array substrate AS. Even if the light-emitting elements LED are not correctly aligned after the transferring process, it only requires reworking on the light-emitting element substrate LS at most. Accordingly, compared to the display device with the light-emitting elements LED directly transferred onto the array substrate AS by the mass transfer technique, the display device 20 can have a higher yield production.

Figure 6:
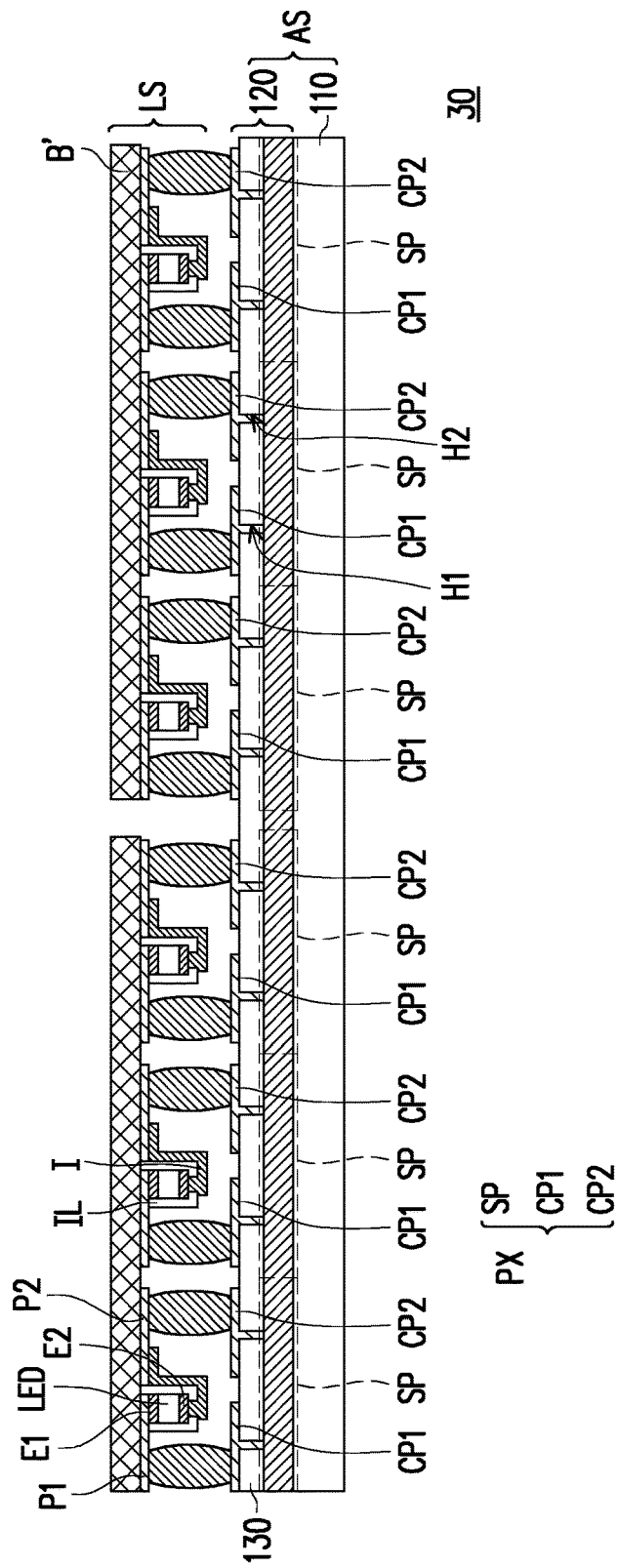
FIG. 6 is a schematic cross-sectional view of a display device according to an embodiment of the disclosure.

FIG. 6 is a schematic cross-sectional view of a display device according to an embodiment of the disclosure. It should be noted that the reference numerals and a part of the contents in the embodiment of FIG. 2 are also used to describe the embodiment of FIG. 6, in which the same reference numerals are used to represent identical or similar elements, and thus descriptions of the same technical contents are omitted. The omitted description can refer to the foregoing embodiment, which is not repeated hereinafter. A major difference between a display device 30 of FIG. 6 and the display device 10 of FIG. 2 is that the light-emitting elements LED are disposed differently. With reference to FIG. 6, the light-emitting elements LED of the display device 30 are, for example, vertical-type light-emitting diodes. One of the first connection terminal E1 and the second connection terminal E2 of each of the light-emitting elements LED faces the corresponding substrate B', and another one of the first connection terminal E1 and the second connection terminal E2 of each of the light-emitting elements LED faces the array substrate AS. In the embodiment, the first connection terminal E1 of each of the light-emitting elements LED faces the corresponding substrate B' and the second connection terminal E2 faces the array substrate AS. In some embodiments, the light-emitting element LED can include an insulation layer IL on the surface and exposing the first connection terminal E1 and the second connection terminal E2.

In the embodiment, after the light-emitting elements LED are transferred onto the substrate B', the first connection terminal E1 of the light-emitting element LED is electrically connected to the corresponding first connection pad P1. Next, a connection structure I is formed on the light-emitting element LED to electrically connect the second connection terminal E2 of the light-emitting element LED to the corresponding second connection structure P2.

Based on the above, since the light-emitting elements LED are located in the light-emitting element substrate LS, the light-emitting element substrate LS with the light-emitting elements LED correctly aligned after the transferring process may be directly chosen to be electrically connected to the array substrate AS. Even if the light-emitting elements LED are not correctly aligned after the transferring process, it only requires reworking on the light-emitting element substrate LS at most. Accordingly, compared to the display device with the light-emitting elements LED directly transferred onto the array substrate AS by the mass transfer technique, the display device 30 can have a higher yield production.

Figure 7:
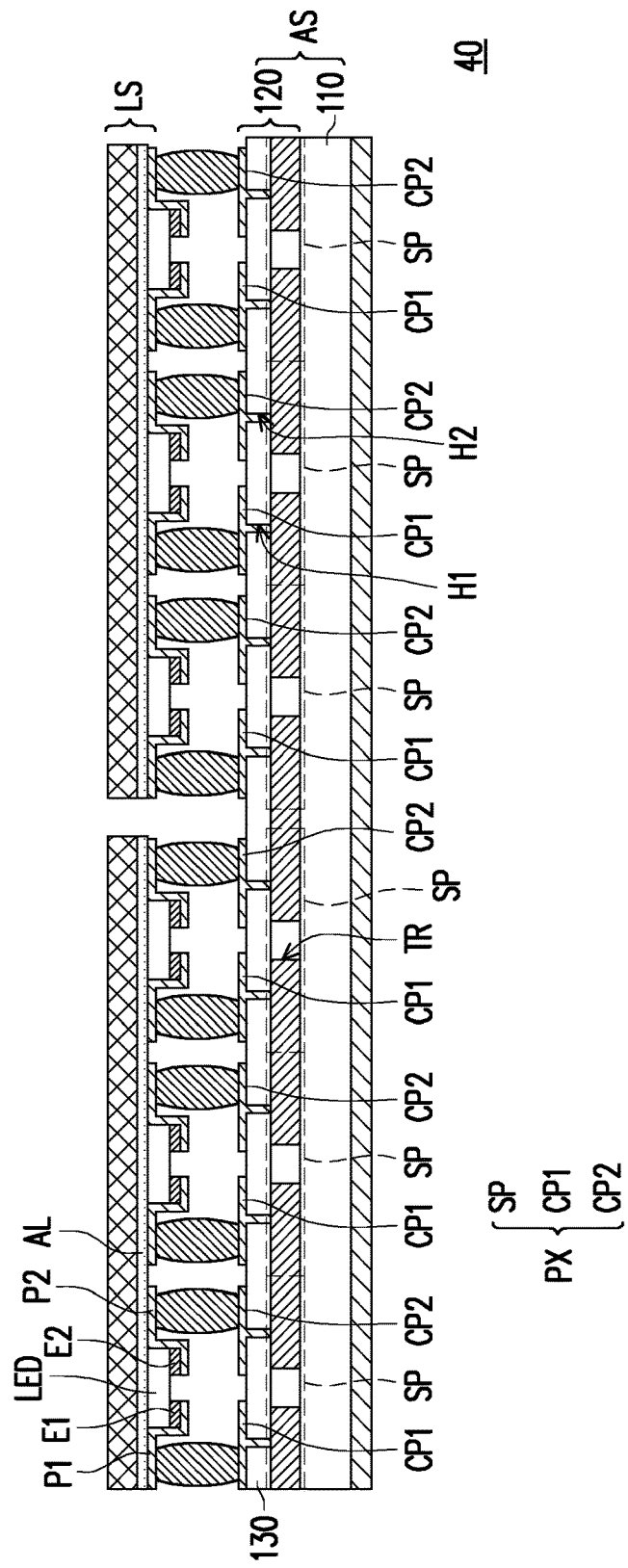
FIG. 7 is a schematic cross-sectional view of a display device according to an embodiment of the disclosure.

FIG. 7 is a schematic cross-sectional view of a display device according to an embodiment of the disclosure. It should be noted that the reference numerals and a part of the contents in the embodiment of FIG. 5 are also used to describe the embodiment of FIG. 7, in which the same reference numerals are used to represent identical or similar elements, and thus descriptions of the same technical contents are omitted. The omitted description can refer to the foregoing embodiment, which is not repeated hereinafter. A major difference between a display device 40 of FIG. 7 and the display device 20 of FIG. 5 is that the active element layers 120 are disposed differently.

In this embodiment, the active element layer 120 includes a transparent region TR corresponding to each of the light-emitting elements LED. Wires, active elements and passive devices in the sub-pixel circuit SP are not disposed in the transparent region TR, for example. With such design of the transparent region TR, a luminous efficiency of the display device 40 may be improved. In some embodiments, a color conversion layer (not illustrated) may be disposed in the transparent region TR to further improve a color purity or a color saturation on each color for the display device 40.

Based on the above, since the light-emitting elements LED are located in the light-emitting element substrate LS, the light-emitting element substrate LS with the light-emitting elements LED correctly aligned after the transferring process may be directly chosen to be electrically connected to the array substrate AS. Even if the light-emitting elements LED are not correctly aligned after the transferring process, it only requires reworking on the light-emitting element substrate LS at most. Accordingly, compared to the display device with the light-emitting elements LED directly transferred onto the array substrate AS by the mass transfer technique, the display device 40 can have a higher yield production.

Figure 8A:
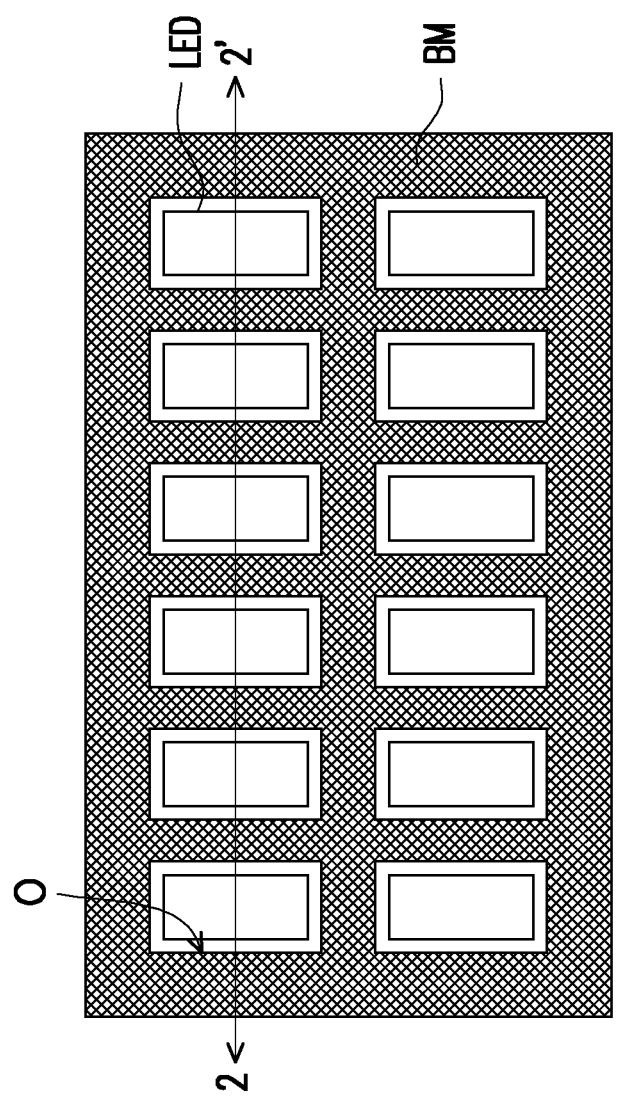
FIG. 8A is a schematic top view of a display device according to an embodiment of the disclosure.
Figure 8B:
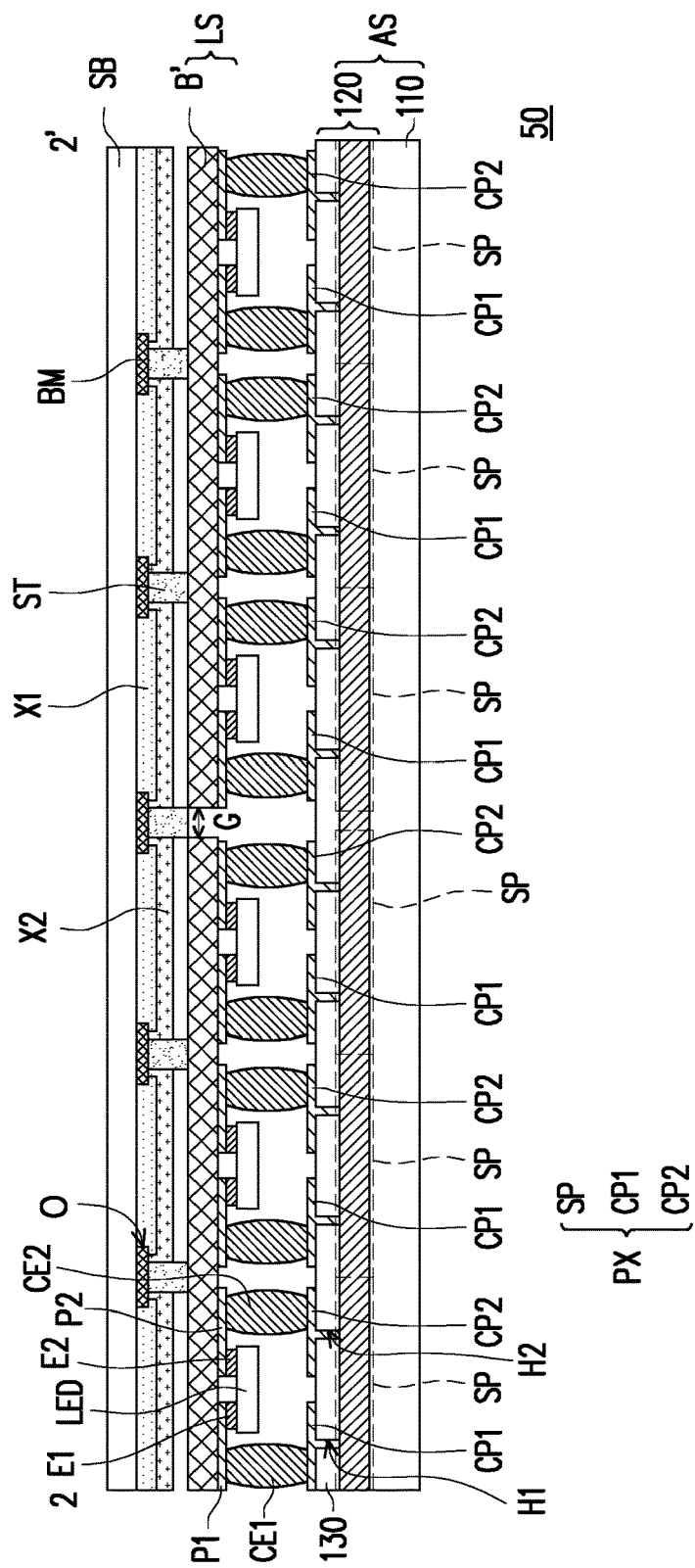
FIG. 8B is a schematic cross-sectional view taken along a section line 22' depicted in FIG. 8A.

FIG. 8A is a schematic top view of a display device according to an embodiment of the disclosure. FIG. 8B is a schematic cross-sectional view taken along a section line 22' depicted in FIG. 8A, wherein FIG. 8B illustrates the light-emitting elements LED and a light shielding layer BM with illustration of other members omitted. It should be noted that the reference numerals and a part of the contents in the embodiment of FIG. 2 are also used to describe the embodiments of FIG. 8A and FIG. 8B, in which the same reference numerals are used to represent identical or similar elements, and thus descriptions of the same technical contents are omitted. The omitted description can refer to the foregoing embodiment, which is not repeated hereinafter.

With reference to FIG. 8A and FIG. 8B, a display device 50 further includes the light shielding layer BM. The light shielding layer BM is disposed on the at least two light-emitting element substrates LS and shielding (or namely covers on) the gap G between the at least two light-emitting element substrates LS. The light shielding layer BM has a plurality of openings O respectively exposing the light-emitting elements LED of the light-emitting element substrates LS.

In the embodiment, the light shielding layer BM is disposed on a substrate SB. One substrate SB is disposed corresponding to multiple light-emitting element substrates LS. The light-emitting element substrates LS are located between the substrate SB and the array substrate AS. In this embodiment, supporting members ST may be optionally included between the substrate SB and the light-emitting element substrate SL. The supporting member ST is, for example, disposed corresponding to the light shielding layer BM, but the disclosure is not limited thereto.

In the embodiment, the display device 50 may optionally further include a first color conversion element X1. The first color conversion element X1 is located on the light-emitting element substrate LS, and the light-emitting direction of the light-emitting elements LED faces the substrate B' of each of the light-emitting element substrates LS. In some embodiments, the first color conversion element X1 may include a red color filter element, a green color filter element, a blue color filter element, and these color filter elements in different colors may be disposed corresponding to different light-emitting elements LED, respectively. For instance, if three sub-pixels are a red sub-pixel, a green sub-pixel and a blue sub-pixel, respectively, the first color conversion element X1 includes the red color filter element, the green color filter element, and the blue color filter element respectively corresponding to the red sub-pixel, the green sub-pixel and the blue sub-pixel. The light-emitting elements for the sub-pixels in different colors may select use of light-emitting elements of red light, blue light or green light. In some embodiments, the light-emitting elements for the sub-pixels in different colors may select use of a light-emitting element of white light, which is able to display different colors through the red color filter element, the green color filter element and the blue color filter element of the first color conversion element X1. In other embodiments, the light-emitting elements for the sub-pixels in different colors may select use of the light-emitting elements of blue light and/or ultraviolet light. In this case, different colors may be displayed through the red conversion element, the green conversion element and the blue conversion element of the first color conversion element X1. If a light color of the light-emitting elements LED is the blue light, it is also possible that the blue conversion element is not disposed based on such choice.

In this embodiment, the display device 50 may optionally further include a second color conversion element X2. The second color conversion element X2 is located on the light-emitting element substrate LS, and the second color conversion element X2 is located between the first color conversion element X1 and the light-emitting element LED. In certain embodiments, the second color conversion element X2 may include a red quantum dot material, a green quantum dot material and a blue quantum dot material, and these quantum dot materials in different colors may be disposed respectively corresponding to the different light-emitting elements LED. In this case, the light-emitting element LED may select use the light-emitting element of ultraviolet light or blue light. In other embodiments, the display device 50 may optionally further include the second color conversion element X2 and exclude the first color conversion element X1. The second color conversion element X2 is located on the light-emitting element substrate LS, and the light-emitting element LED may select use of the light-emitting element of ultraviolet light or blue light. If a light color of the light-emitting elements LED is the blue light, it is also possible that the blue quantum dot material is not disposed based on such choice.

Based on the above, since the light-emitting elements LED are located in the light-emitting element substrate LS, the light-emitting element substrate LS with the light-emitting elements LED correctly aligned after the transferring process may be directly chosen to be electrically connected to the array substrate AS. Even if the light-emitting elements LED are not correctly aligned after the transferring process, it only requires reworking on the light-emitting element substrate LS at most. Accordingly, compared to the display device with the light-emitting elements LED directly transferred onto the array substrate AS by the mass transfer technique, the display device 50 can have a higher yield production.

Figure 9A:
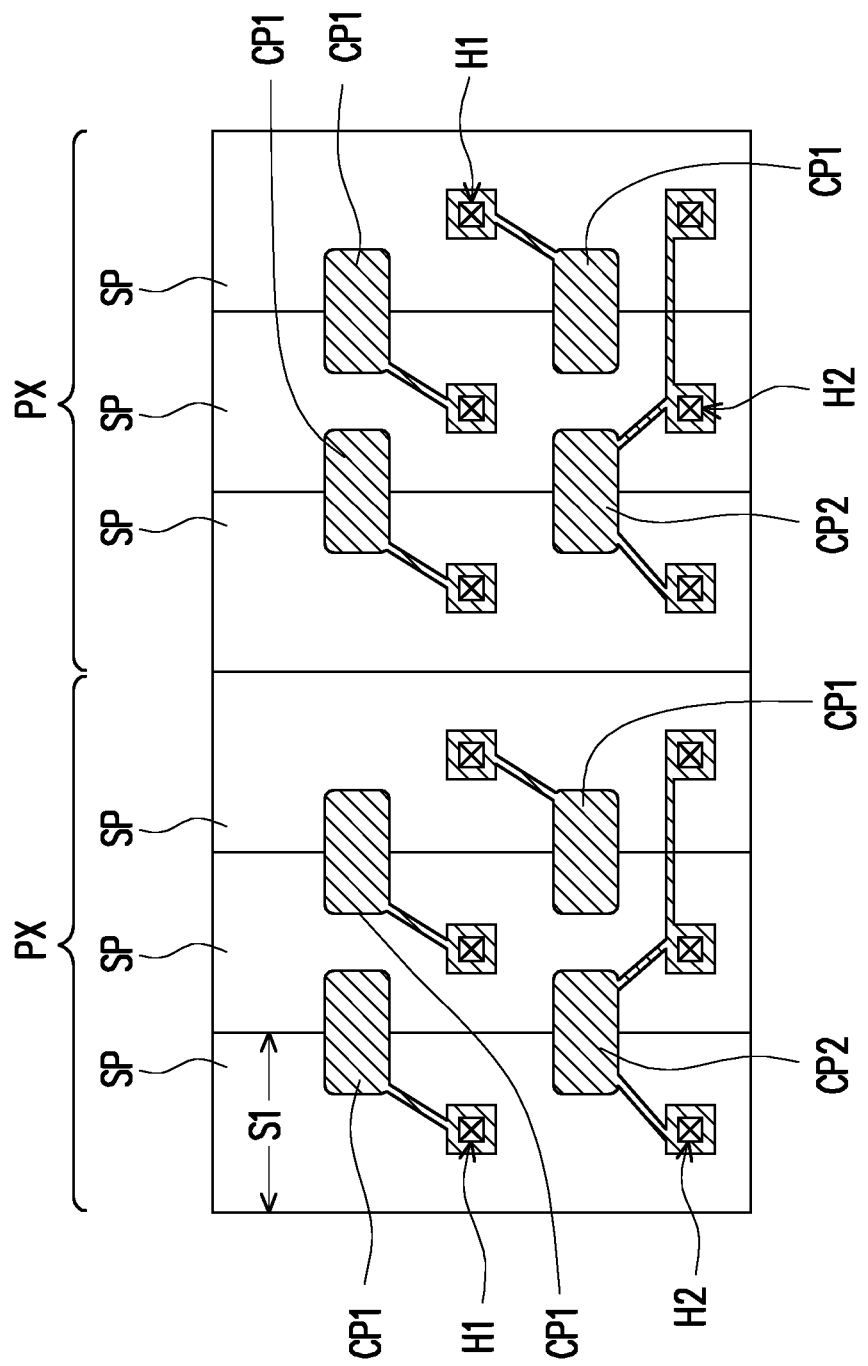
FIG. 9A is a schematic top view of a pixel circuit according to an embodiment of the disclosure.
Figure 9B:
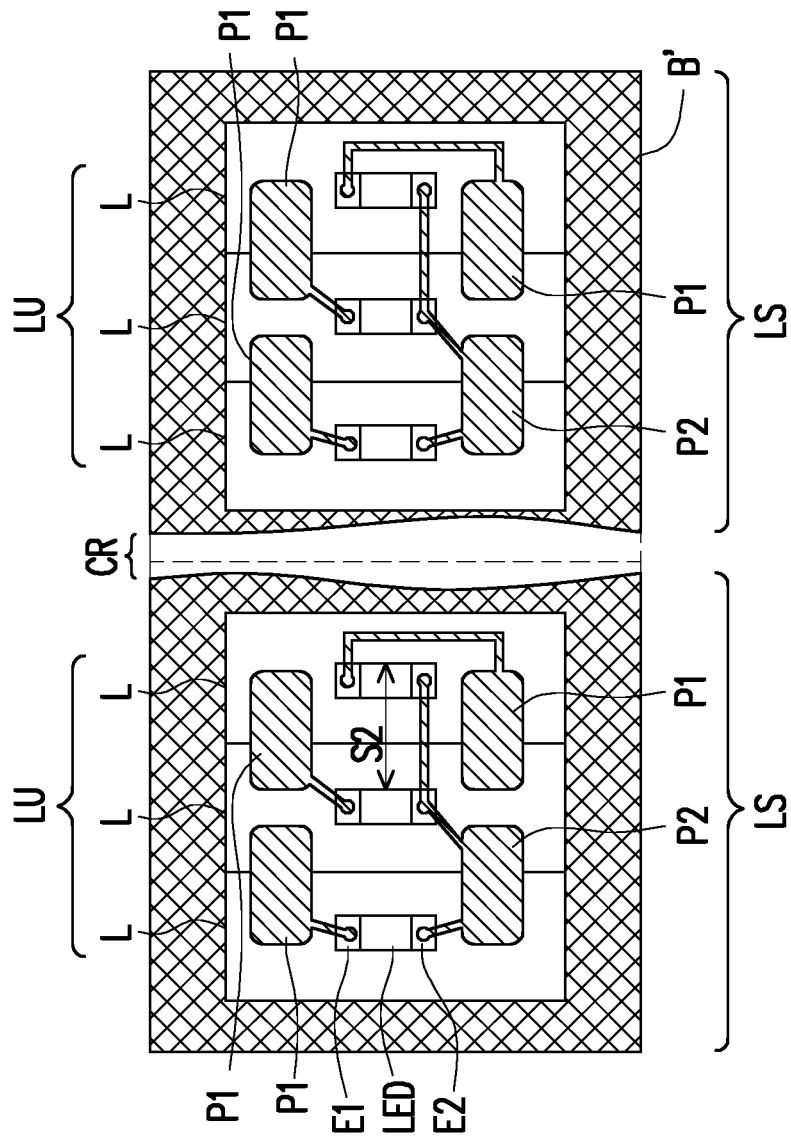
FIG. 9B is a schematic top view of a light-emitting element substrate according to an embodiment of the disclosure.

FIG. 9A is a schematic top view of a pixel circuit according to an embodiment of the disclosure. FIG. 9B is a schematic top view of a light-emitting element substrate according to an embodiment of the disclosure. It should be noted that the reference numerals and a part of the contents in the embodiment of FIG. 2 are also used to describe the embodiments of FIG. 9A and FIG. 9B, in which the same reference numerals are used to represent identical or similar elements, and thus descriptions of the same technical contents are omitted. The omitted description can refer to the foregoing embodiment, which is not repeated hereinafter.

With reference to FIG. 9A, each of the pixel circuits PX includes at least three said sub-pixel circuits SP, at least three said first conductive pads CP1, and one said second conductive pad CP2. With reference to FIG. 2, FIG. 3 and FIG. 9A, the first conductive pads CP1 of each of the pixel circuits PX are electrically connected to the second terminal SD2 of corresponding one of the driving element T1 through the first openings H1 of the insulation layer 130, and the second conductive pad CP2 of each of the pixel circuits PX is electrically connected to the second power line PL2 through the second opening H2 of the insulation layer 130. In the embodiment, each of the sub-pixel circuits SP has one said first opening H1 and one said second opening H2, but the disclosure is not limited thereto. A pitch S1 is provided between adjacent two of the sub-pixel circuits SP. A width of the pixel circuit PX is approximately equal to three times the pitch S1. In the embodiment, a boundary is provided between adjacent two of the sub-pixel circuits SP, and at least one of the first conductive pads CP1 and/or the second conductive pad CP2 partially overlap with the boundary between adjacent two of the sub-pixel circuits SP.

With reference to FIG. 9B, each of the light-emitting element substrates LS includes the substrate B', at least three said light-emitting elements LED, at least three said first connection pads P1 and the second connection pad P2. In the embodiment, each of the light-emitting element substrates LS includes at least one light-emitting unit LU. Each light-emitting unit LU includes at least three light-emitting regions L, and at least one light-emitting element LED is included in each of the light-emitting regions L. A width of the light-emitting region L is approximately equal to a pitch S2 between adjacent two of the light-emitting elements LED. A width of the light-emitting unit LU is approximately equal to three times the pitch S2.

In this embodiment, the pitch S2 between adjacent two of the light-emitting elements LED is less than the pitch S1 between adjacent two of the sub-pixel circuits, i.e., the width of the light-emitting unit LU is less than the width of the pixel circuit PX. Accordingly, in the process of manufacturing the light-emitting element substrates LS, a cutting line CR may be wider when the carrier substrate is to be cut, and the corresponding sub-pixel circuit SP of each of the light-emitting elements LED may have a larger wiring layout space.

Figure 10:
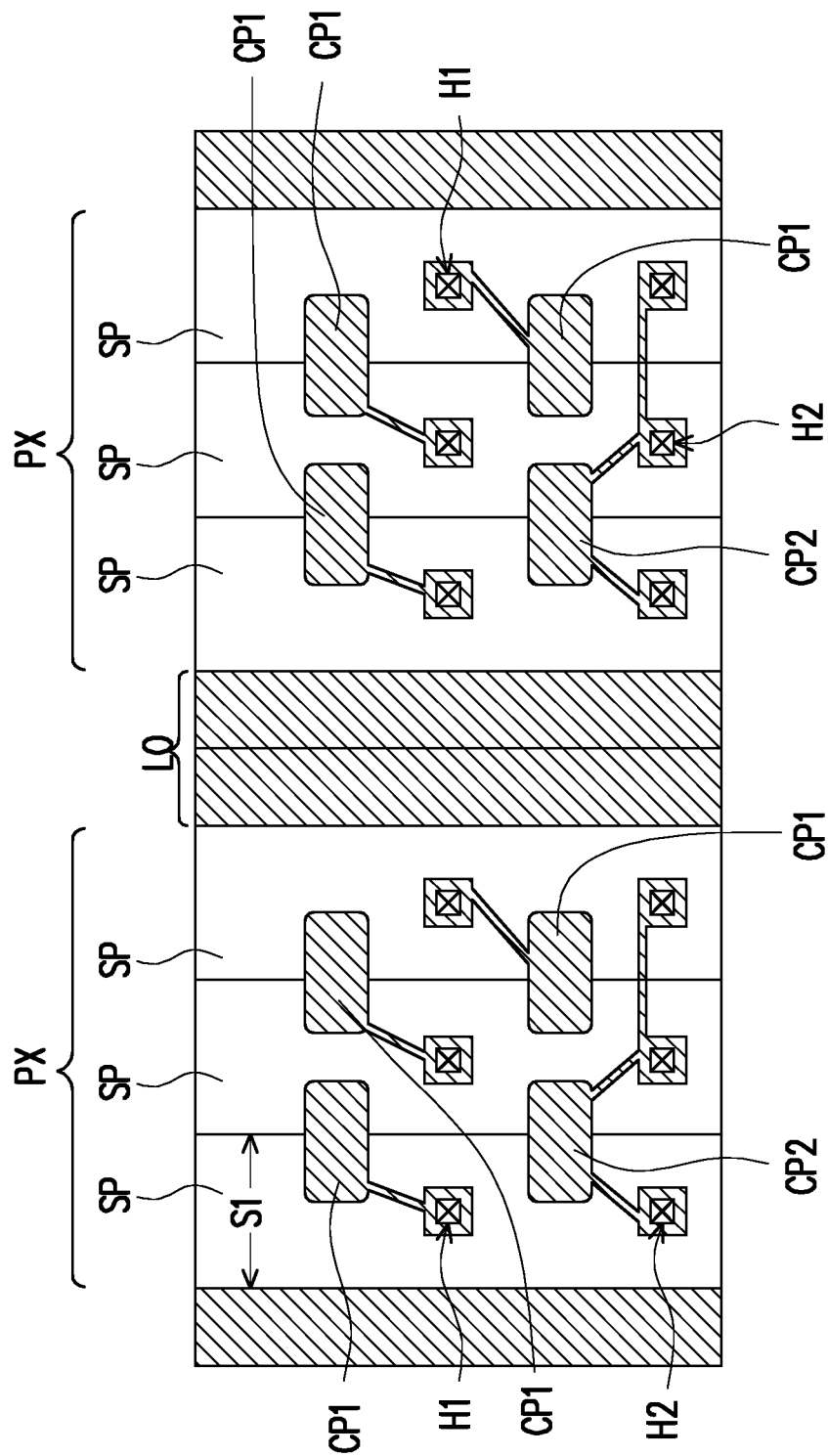
FIG. 10 is a schematic top view of a pixel circuit according to an embodiment of the disclosure.

FIG. 10 is a schematic top view of a pixel circuit according to an embodiment of the disclosure. It should be noted that the reference numerals and a part of the contents in the embodiments of FIG. 9A and FIG. 9B are also used to describe the embodiment of FIG. 10, in which the same reference numerals are used to represent identical or similar elements, and thus descriptions of the same technical contents are omitted. The omitted description can refer to the foregoing embodiment, which is not repeated hereinafter.

In the present embodiment, a wiring space LO is provided between adjacent two of the pixel circuits PX. In certain embodiments, at least one of the first power line PL1 and the second power line PL2 is located in the wiring space LO between the two pixel circuits PX.

In some embodiments, the pitch S2 between adjacent two of the light-emitting elements LED is approximately equal to the pitch S1 between adjacent two of the sub-pixel circuits, i.e., the width of the light-emitting unit LU is approximately equal to the width of the pixel circuit PX.

By disposing at least one of the first power line PL1 and the second power line PL2 between the two pixel circuits PX, the influence of the first power line PL1 and the second power line PL2 on the luminous efficiency of the display device may be reduced.

Figure 11:
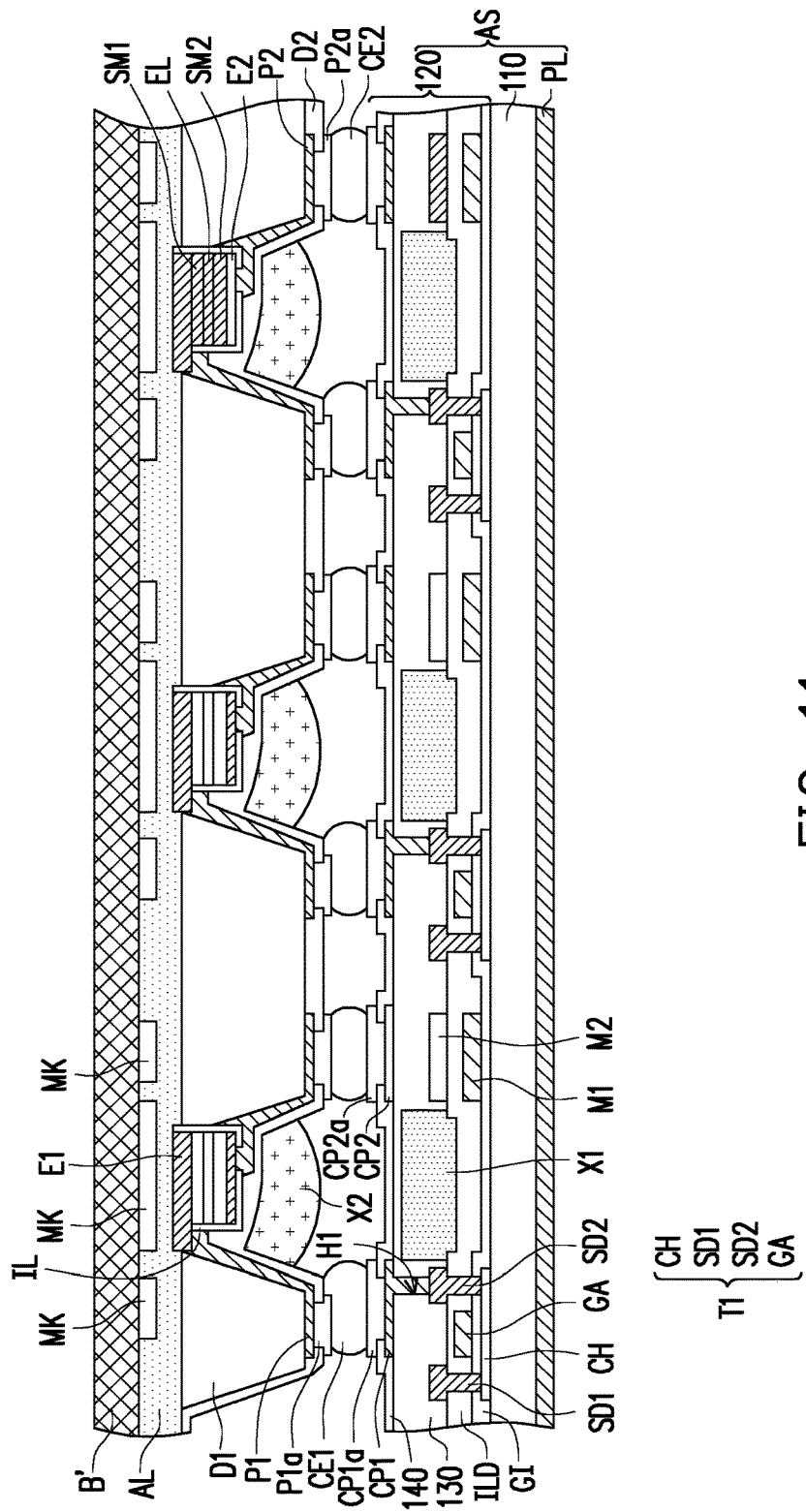
FIG. 11 is a schematic partial cross-sectional view of a display device according to an embodiment of the disclosure.

FIG. 11 is a schematic partial cross-sectional view of a display device according to an embodiment of the disclosure. It should be noted that the reference numerals and a part of the contents in the embodiment of FIG. 6 are also used to describe the embodiment of FIG. 11, in which the same reference numerals are used to represent identical or similar elements, and thus descriptions of the same technical contents are omitted. The omitted description can refer to the foregoing embodiment, which is not repeated hereinafter.

With reference to FIG. 3 and FIG. 11, in this embodiment, the array substrate AS includes the carrier substrate 110 and the active element layer 120. The active element layer 120 is located on the carrier substrate 110 and includes at least two said pixel circuits PX, a first power line and a second power line (e.g., the first power line PL1 and the second power line PL2). Here, illustration of a part of members in the array substrate AS is omitted in FIG. 11. Each of the pixel circuits PX includes at least three said sub-pixel circuit SP, at least three said first conductive pads CP1 and the second conductive pad CP2. Each of the sub-pixel circuits SP at least includes the driving element T1, the switching element T2 and the signal lines SL.

Referring to FIG. 3 and FIG. 11, in the embodiment, the driving element T1 has a semiconductor channel layer CH, the first terminal SD1, the second terminal SD2 and the control terminal GA. The semiconductor channel layer CH overlaps with the control terminal GA, and an insulation layer GI is interposed between the semiconductor channel layer CH and the control terminal GA. The control terminal GA of the driving element T1 is electrically connected to the signal lines SL (e.g., the signal line SL1 and the signal line SL2) and the switching element T2. An insulation layer ILD covers the insulation layer GI, and the first terminal SD1 and the second terminal SD2 of the driving element T1 penetrate through the insulation layer GI and the insulation layer ILD to be electrically connected to the semiconductor channel layer CH. The first terminal SD1 of the driving element T1 is electrically connected to the first power line PL1. The insulation layer 130 covers the insulation layer ILD. The first conductive pad CP1 is located on the insulation layer 130, and electrically connected to the second terminal SD2 of the driving element T1 through the first opening H1 of the insulation layer 130. The second conductive pad CP2 is located on the insulation layer 130, and electrically connected to the second power line PL2 through the second opening H2 of the insulation layer 130 (referring to FIG. 2 and FIG. 9A).

In some embodiments, the array substrate AS may optionally further include an insulation layer 140, a pad CP1a and a pad CP2a. The insulation layer 140 covers the insulation layer 130, and exposes the first conductive pad CP1 and the second conductive pad CP2. The pad CPa1 and the pad CPa2 are located on the insulation layer 140 and electrically connected to the first conductive pad CP1 and the second conductive pad CP2, respectively.

The array substrate AS may optionally further include a first conductive layer M1 and a second conductive layer M2. The first conductive layer M1 may, for example, belong to the same conductive film layer as the control terminal GA of the driving element T1, and the second conductive layer M2 may, for example, belong to the same conductive film layer as the first terminal SD1 and the second terminal SD2 of the driving element T1. However, the disclosure is not limited in this regard. The first conductive layer M1 and the second conductive layer M2 may, for example, serve as the signal line, the power line, the capacitor or other members.

In the embodiment, the array substrate AS further includes the first color conversion elements X1. The first color conversion elements X1 are disposed corresponding to the light-emitting elements LED of each of the light-emitting element substrates LS. For instance, three said color conversion elements X1 are disposed corresponding to three said light-emitting elements LED.

The light-emitting element substrate LS is electrically connected to the corresponding pixel circuit PX. Each of the light-emitting element substrates LS includes the substrate B', at least three said light-emitting elements LED, at least three said first connection pads P1 and the second connection pad P2. The light-emitting elements LED are located on the substrate B'. In this embodiment, the light-emitting elements LED are vertical-type light-emitting elements. The light-emitting element LED has the first connection terminal E1, a semiconductor layer SM1, a light-emitting layer EL, a semiconductor layer SM2 and the second connection terminal E2 stacked together. The light-emitting elements LED are fixed on the substrate B' by the adhesive layer AL. In some embodiments, an alignment mark MK is provided between the adhesive layer AL and the substrate B', and the alignment mark MK may serve as a mark for alignment when the light-emitting elements LED are to be transferred.

At least three said first connection pads P1 are respectively and electrically connected to the first connection terminal E1 of the corresponding light-emitting element LED. The second connection pad P2 is electrically connected to the second connection terminals E2 of the three light-emitting elements LED, and each of the first connection pads P1 is separated from the second connection pad P2. Although there are three separate second connection pads P2 depicted in FIG. 11, the second connection pads P2 electrically connected to the three light-emitting elements LED are actually interconnected, i.e., one said second connection pads P2 of the light-emitting element substrate LS corresponds to three said light-emitting elements LED.

The light-emitting element substrate LS may optionally further include three banks D1, and each of the banks (or namely walls) D1 corresponds to and is disposed on at least a portion of each of the light-emitting elements LED. A portion of the corresponding first connection pad P1 of each of the light-emitting elements LED and a portion of the corresponding second connection pad P2 of each of the light-emitting elements LED are disposed on a portion of the corresponding bank D1 of each of the light-emitting elements LED. In some embodiments, preferably, the bank D1 surrounds the light-emitting element LED, but not limited thereto. In some embodiments, more preferably, the first connection pad P1 and the second connection pad P2 located on the bank D1 may also serve as reflection layers to make a light emitted by the light-emitting element LED more concentrated.

In the embodiment, the bank D1 may optionally further include an insulation layer D2. A pad P1a and a pad P2a are located on the insulation layer D2 and electrically connected to the first connection pad P1 and the second connection pad P2, respectively. In this embodiment, the first connection element CE1 is electrically connected to the corresponding first connection pad P1 through the pad P1a. In the embodiment, the second connection element CE2 is electrically connected to the corresponding second connection pad P2 through the pad P2a.

The first connection elements CE1 respectively and electrically connect corresponding one of the first conductive pads CP1 to corresponding one of the first connection pads P1. The second connection elements CE2 respectively and electrically connect corresponding one of the second conductive pads CP2 to corresponding one of the second connection pads P2. In an embodiment, by extending the bank D1 towards an inner surface of the carrier substrate 110, the portion of the first connection pad P1 and the portion of the second connection pad P2 may be closer to the first conductive pad CP1 and the second conductive pad CP2 or the pad P1a and the pad P2a may be closer to the first conductive pad CP1 and the second conductive pad CP2, so as to reduce the amount of the first connection elements CE1 and the second connection elements CE2 being used. Moreover, by doing so, not only can the first connection pads P1 on different substrates be in contact with the first conductive pads CP1 through the first connection elements CE1 more easily, and the second connection pads P2 may also be in contact with the second conductive pads CP2 through the second connection elements CE2 more easily to improve a connection stability.

Each of the light-emitting element substrates LS may optionally further include three said second color conversion elements X2. The second color conversion elements X2 are located between the three light-emitting elements LED and the three first color conversion elements X1. In some embodiments, the first color conversion element X1 may include a red color filter element, a green color filter element, a blue color filter element, and these color filter elements in different colors may be disposed corresponding to different light-emitting elements LED, respectively. In certain embodiments, the second color conversion element X2 may include a red quantum dot material, a green quantum dot material and a blue quantum dot material, and these quantum dot materials in different colors may be disposed respectively corresponding to the different light-emitting elements LED. In the embodiment, the light-emitting direction of the lights-emitting elements LED faces the array substrate AS. In an embodiment, the display device may optionally further include the polarizer PL located on the light-emitting direction of the light-emitting elements LED. For instance, the polarizer PL is located on the outer surface of the carrier substrate 110, but not limited thereto. Therefore, the user views the outer surface of the carrier substrate 110 or the outer surface of the polarizer PL instead of viewing the outer surface of the substrate B'. In this case, the outer surface of the carrier substrate 110 or the outer surface of the polarizer PL may be regarded as the display surface.

Figure 12:
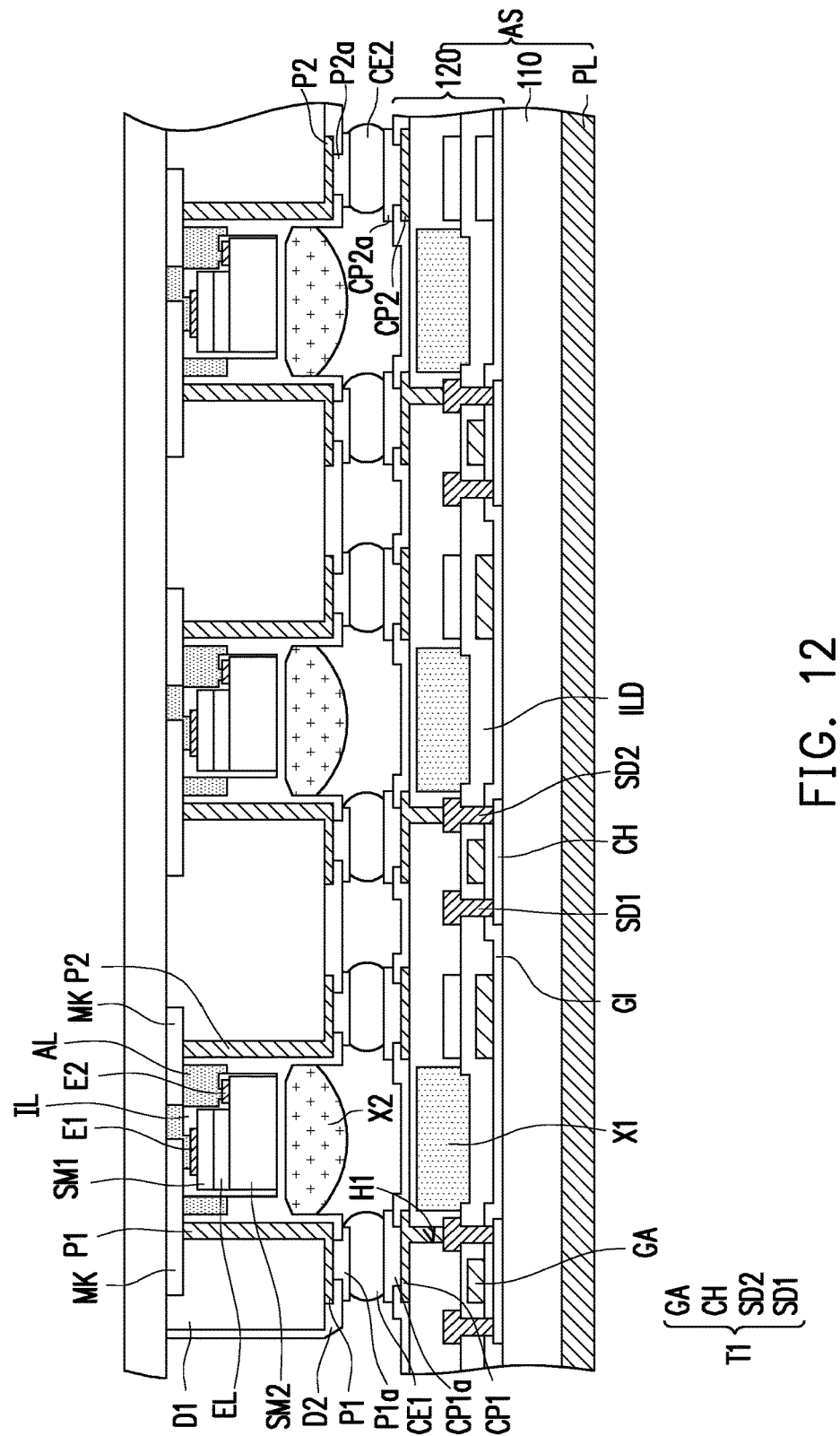
FIG. 12 is a schematic partial cross-sectional view of a display device according to an embodiment of the disclosure.

FIG. 12 is a schematic partial cross-sectional view of a display device according to an embodiment of the disclosure. It should be noted that the reference numerals and a part of the contents in the embodiment of FIG. 11 are also used to describe the embodiment of FIG. 12, in which the same reference numerals are used to represent identical or similar elements, and thus descriptions of the same technical contents are omitted. The omitted description can refer to the foregoing embodiment, which is not repeated hereinafter.

A major difference between the embodiment of FIG. 12 and the embodiment of FIG. 11 is that, the light-emitting elements LED of the light-emitting element substrate LS are different.

Referring to FIG. 12, in this embodiment, the light-emitting elements LED are horizontal-type light-emitting elements, and the first connection terminal E1 and the second connection terminal E2 of the light-emitting element LED face the substrate B'. In this embodiment, the light-emitting element LED has the semiconductor layer SM1, the light-emitting layer EL and the semiconductor layer SM2 stacked together. The insulation layer IL is provided on the surface of the light-emitting element LED. The insulation layer IL exposes portions of the semiconductor layer SM1 and the semiconductor layer SM2. The first connection terminal E1 and the second connection terminal E2 are respectively and electrically connected to the semiconductor layer SM1 and the semiconductor layer SM2.

In the embodiment, the light-emitting element LED is fixed on the substrate B' by the adhesive layer AL. The adhesive layer AL is, for example, an anisotropic conductive adhesive which can conduct currents in a flowing direction perpendicular to a normal direction of the substrate B'. In this embodiment, the first connection terminal E1 and the second connection terminal E2 of the light-emitting element LED are electrically connected to the alignment mark MK by the adhesive layer AL, and then respectively and electrically connected to the first connection pad P1 and the second connection pad P2 through the alignment mark MK.

Further, in the foregoing embodiments, at least one of the driving element T1, the switching element T2 and other active elements can adopt use of a thin film transistor (TFT) such as a bottom-gate transistor, a top-gate transistor, a three dimensional transistor or other suitable transistors. A gate of the bottom-gate transistor is located below the semiconductor layer, and a gate of the top-gate transistor is located above the semiconductor layer. A semiconductor channel layer of the three dimensional transistor extends in a non-planar manner. The semiconductor layer may be a single-layer or multi-layer structure, and made of an amorphous silicon, a micro crystalline silicon, a nano crystalline silicon, a polycrystalline silicon, a mono crystalline silicon, an organic semiconductor material, an oxide semiconductor material, a carbon nanotube/rod, a perovskite material, or other suitable materials, or a combination of the above. In the foregoing embodiments, the polarizer PL may be a common polarizing film, a plurality of substantially parallel grid structures, or polarizers with other suitable structures.

In summary, because the light-emitting elements are located in the light-emitting element substrate, the light-emitting element substrate with the light-emitting elements correctly aligned after the transferring process may be directly chosen to be electrically connected to the array substrate. Even if the light-emitting elements are not correctly aligned after the transferring process, it only requires reworking on the light-emitting element substrate at most. Accordingly, compared to the display device with the light-emitting elements directly transferred onto the array substrate by the mass transfer technique, the display device of the disclosure can have a higher yield production.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A display device, comprising:
    an array substrate, comprising:
        a carrier substrate;
        an active element layer, located on the carrier substrate, and comprising two pixel circuits, a first power line and a second power line, wherein each of the two pixel circuits comprises:
            at least three sub-pixel circuits, each of the at least three sub-pixel circuits comprising a driving element, a switching element and a signal line, the driving element having a first terminal, a second terminal and a control terminal, the control terminal of the driving element being electrically connected to the signal line and the switching element, the first terminal of the driving element being electrically connected to the first power line;
            at least three first conductive pads, each of the at least three first conductive pads being correspondingly and electrically connected to the second terminal of the respective driving element; and
            a second conductive pad, electrically connected to the second power line;
    at least two light-emitting element substrates, respectively and electrically connected to corresponding one of the two pixel circuits, each of the at least two light-emitting element substrates comprising:
        a substrate;
        at least three light-emitting elements, located on the substrate, and each of the at least three light-emitting elements having a first connection terminal and a second connection terminal;
        at least three first connection pads, respectively and electrically connected to the first connection terminal of corresponding one of the at least three light-emitting elements; and
        a second connection pad, electrically connected to the second connection terminals of the at least three light-emitting elements, each of the at least three first connection pads being separated from the second connection pad;

a plurality of first connection elements, respectively and electrically connecting corresponding one of the at least three first conductive pads to corresponding one of the at least three first connection pads; and a plurality of second connection elements, respectively and electrically connecting corresponding one of the second conductive pads to corresponding one of the second connection pads.

2. The display device of claim 1, wherein the at least two light-emitting element substrates exclude an active element.

3. The display device of claim 1, wherein the first connection terminal and the second connection terminal of each of the at least three light-emitting elements face the corresponding substrate.

4. The display device of claim 1, wherein the first connection terminal and the second connection terminal of each of the at least three light-emitting elements face the array substrate.

5. The display device of claim 1, wherein one of the first connection terminal and the second connection terminal of each of the at least three light-emitting elements faces the corresponding substrate, and another one of the first connection terminal and the second connection terminal of each of the at least three light-emitting elements faces the array substrate.

6. The display device of claim 1, wherein a gap is provided between the at least two light-emitting element substrates.

7. The display device of claim 6, further comprising: a light shielding layer, disposed on the at least two light-emitting element substrates and shielding the gap, wherein the light shielding layer has a plurality of openings respectively exposing the at least three light-emitting elements of the at least two light-emitting element substrates.

8. The display device of claim 1, wherein the active element layer comprises a transparent region corresponding to each of the at least three light-emitting elements.

9. The display device of claim 1, further comprising: a polarizer, located on the carrier substrate, wherein a light-emitting direction of the at least three light-emitting elements faces the carrier substrate.

10. The display device of claim 1, wherein the array substrate further comprises a plurality of first color conversion elements disposed corresponding to the at least three light-emitting elements of each of the at least two light-emitting element substrates, and a light-emitting direction of the at least three light-emitting elements faces the array substrate.

11. The display device of claim 10, wherein each of the at least two light-emitting element substrates further comprises a plurality of second color conversion elements, located between the at least three light-emitting elements and the plurality of first color conversion elements.

12. The display device of claim 1, wherein each of the at least two light-emitting element substrates further comprises three banks, and each of the three banks corresponds to and is disposed on at least a portion of each of the at least three light-emitting elements.

13. The display device of claim 12, wherein a portion of the corresponding first connection pad of each of the at least three light-emitting elements and a portion of the corresponding second connection pad of each of the at least three light-emitting elements are disposed on a portion of the corresponding bank of each of the at least three light-emitting elements.

14. The display device of claim 1, further comprising: a color conversion element, located on the at least two light-emitting element substrates, wherein a light-emitting direction of the at least three light-emitting elements faces the substrate of each of the at least two light-emitting element substrates.

15. The display device of claim 1, wherein at least one of the first power line and the second power line is located between the two pixel circuits.

16. The display device of claim 1, wherein the array substrate further comprises an insulation layer covering the at least three sub-pixel circuits of each of the two pixel circuits, the at least three first conductive pads of each of the two pixel circuits are electrically connected to the second terminal of corresponding one of the driving elements through at least three first openings of the insulation layer respectively, and the second conductive pad of each of the two pixel circuits is electrically connected to the second power line through a second opening of the insulation layer.

17. The display device of claim 1, wherein a boundary is provided between adjacent two of the at least three sub-pixel circuits, and at least one of the at least three first conductive pads and/or the second conductive pad partially overlapped with the boundary.

* * * * *